(12) United States Patent
Uzoh et al.

(10) Patent No.: US 10,707,087 B2
(45) Date of Patent: Jul. 7, 2020

(54) PROCESSING STACKED SUBSTRATES (71) Applicant: Invensas Bonding Technologies, Inc., San Jose, CA (US)

(72) Inventors: Cyprian Emeka Uzoh, San Jose, CA (US); Guilian Gao, San Jose, CA (US)

(73) Assignee: Invensas Bonding Technologies, Inc., San Jose, CA (US)

( * ) Notice: Subject to any disclaimer, the term of this patent is extended or adjusted under 35 U.S.C. 154(b) by 0 days.

(21) Appl. No.: 15/846,731

(22) Filed: Dec. 19, 2017

(65) Prior Publication Data

US 2018/0182639 A1 Jun. 28, 2018

Related U.S. Application Data (60) Provisional application No. 62/439,771, filed on Dec. 28, 2016.

(51) Int. Cl.
| | |
|---|---|
| *H01L 21/311* | (2006.01) |
| *H01L 21/683* | (2006.01) |
| *H01L 21/78* | (2006.01) |
| *H01L 21/02* | (2006.01) |

(52) U.S. Cl.
CPC .. *H01L 21/31111* (2013.01); *H01L 21/02057* (2013.01); *H01L 21/31133* (2013.01); *H01L 21/6835* (2013.01); *H01L 21/6836* (2013.01); *H01L 21/78* (2013.01); *H01L 2221/6834* (2013.01); *H01L 2221/68327* (2013.01); *H01L 2221/68381* (2013.01)

(58) Field of Classification Search
CPC ............ H01L 21/6835; H01L 21/6836; H01L 2221/68327; H01L 2221/6834; H01L 2221/68381; H01L 21/02057; H01L 21/31111; H01L 21/31133; H01L 21/78
See application file for complete search history.

(56) References Cited

U.S. PATENT DOCUMENTS

| | | | |
|---|---|---|---|
| 7,226,812 B2 * | 6/2007 | Lu | ........................ H01L 21/6835 257/E21.502 |
| 7,795,113 B2 | 9/2010 | Swinnen et al. | |
| 7,932,614 B2 * | 4/2011 | Codding | ............. H01L 21/6835 257/783 |

(Continued)

FOREIGN PATENT DOCUMENTS

JP 2014-508405 A 4/2014

OTHER PUBLICATIONS

Monk et. al., "Hydrofluoric Etching of Silicon Dioxide Sacrificial Layers", J. ElectroChem. Soc., 141, pp. 270-274 (Year: 1994).*

(Continued)

*Primary Examiner* — Bilkis Jahan
*Assistant Examiner* — Victor V Barzykin (57) ABSTRACT

Representative implementations provide techniques for processing integrated circuit (IC) dies and related devices, in preparation for stacking and bonding the devices. The disclosed techniques provide removal of processing residue from the device surfaces while protecting the underlying layers. One or more sacrificial layers may be applied to a surface of the device during processing to protect the underlying layers. Processing residue is attached to the sacrificial layers instead of the device, and can be removed with the sacrificial layers.

21 Claims, 5 Drawing Sheets

(56) References Cited

U.S. PATENT DOCUMENTS

| | | | |
|---|---|---|---|
| 8,497,149 B2 | 7/2013 | Laming et al. | |
| 9,450,115 B2 | 9/2016 | Christensen et al. | |
| 10,157,766 B2* | 12/2018 | Kang | H01L 21/4853 |
| 2002/0048906 A1* | 4/2002 | Sakai | H01L 21/67144 |
| | | | 438/464 |
| 2002/0056927 A1* | 5/2002 | Ohuchi | H01L 21/6836 |
| | | | 257/787 |
| 2008/0166525 A1 | 7/2008 | Swinnen et al. | |
| 2009/0152655 A1 | 6/2009 | Laming et al. | |
| 2014/0091458 A1* | 4/2014 | Van Gemert | H01L 21/561 |
| | | | 257/737 |
| 2014/0183728 A1* | 7/2014 | Han | H01L 24/14 |
| | | | 257/737 |
| 2014/0213039 A1* | 7/2014 | Lee | H01L 21/6835 |
| | | | 438/459 |
| 2014/0273334 A1 | 9/2014 | Christensen et al. | |
| 2016/0141260 A1* | 5/2016 | Chang | H01L 21/6836 |
| | | | 438/613 |
| 2016/0181228 A1* | 6/2016 | Higuchi | H01L 25/105 |
| | | | 257/774 |
| 2016/0233111 A1* | 8/2016 | Shiota | H01L 21/304 |
| 2016/0326409 A1* | 11/2016 | Tokuyasu | C09J 7/405 |
| 2016/0358898 A1* | 12/2016 | Zhou | H01L 25/0657 |
| 2017/0069535 A1* | 3/2017 | Masuko | H01L 21/78 |
| 2018/0012751 A1* | 1/2018 | Kamochi | C09J 121/00 |
| 2018/0158713 A1* | 6/2018 | Okita | H01J 37/00 |

OTHER PUBLICATIONS

International Search Report and Written Opinion dated Jun. 25, 2018 for PCT Application No. PCT/US2017/067304, filed Dec. 19, 2017, 13 pages.

* cited by examiner

PROCESSING STACKED SUBSTRATES

PRIORITY CLAIM AND CROSS-REFERENCE TO RELATED APPLICATION

This application claims the benefit under 35 U.S.C. § 119(e)(1) of U.S. Provisional Application No. 62/439,771, filed Dec. 28, 2016, which is hereby incorporated by reference in its entirety.

FIELD

The following description relates to processing of integrated circuits ("ICs"). More particularly, the following description relates to removal of processing residue from the surface of dies, wafers, and other substrates.

BACKGROUND

The demand for more compact physical arrangements of microelectronic elements such as integrated chips and dies has become even more intense with the rapid progress of portable electronic devices, the expansion of the Internet of Things, nano-scale integration, subwavelength optical integration, and more. Merely by way of example, devices commonly referred to as "smart phones" integrate the functions of a cellular telephone with powerful data processors, memory and ancillary devices such as global positioning system receivers, electronic cameras, and local area network connections along with high-resolution displays and associated image processing chips. Such devices can provide capabilities such as full internet connectivity, entertainment including full-resolution video, navigation, electronic banking and more, all in a pocket-size device. Complex portable devices require packing numerous chips and dies into a small space.

Microelectronic elements often comprise a thin slab of a semiconductor material, such as silicon or gallium arsenide. Chips and dies are commonly provided as individual, prepackaged units. In some unit designs, the die is mounted to a substrate or a chip carrier, which is in turn mounted on a circuit panel, such as a printed circuit board (PCB). Dies can be provided in packages that facilitate handling of the die during manufacture and during mounting of the die on the external substrate. For example, many dies are provided in packages suitable for surface mounting. Numerous packages of this general type have been proposed for various applications. Most commonly, such packages include a dielectric element, commonly referred to as a "chip carrier" with terminals formed as plated or etched metallic structures on the dielectric. The terminals typically are connected to the contacts (e.g., bond pads) of the die by conductive features such as thin traces extending along the die carrier and by fine leads or wires extending between the contacts of the die and the terminals or traces. In a surface mounting operation, the package may be placed onto a circuit board so that each terminal on the package is aligned with a corresponding contact pad on the circuit board. Solder or other bonding material is generally provided between the terminals and the contact pads. The package can be permanently bonded in place by heating the assembly so as to melt or "reflow" the solder or otherwise activate the bonding material.

Certain packages, commonly referred to as "chip scale packages," occupy an area of the circuit board equal to, or only slightly larger than, the area of the device incorporated in the package. This scale is advantageous in that it reduces the overall size of the assembly and permits the use of short interconnections between various devices on the substrate, which in turn limits signal propagation time between devices and thus facilitates operation of the assembly at high speeds.

Semiconductor dies can also be provided in "stacked" arrangements, wherein one die is provided on a carrier, for example, and another die is mounted on top of the first die. These arrangements can allow a number of different dies to be mounted within a single footprint on a circuit board and can further facilitate high-speed operation by providing a short interconnection between the dies. Often, this interconnect distance can be only slightly larger than the thickness of the die itself. For interconnection to be achieved within a stack of die packages, interconnection structures for mechanical and electrical connection may be provided on both sides (e.g., faces) of each die package (except for the topmost package). This has been done, for example, by providing contact pads or lands on both sides of the substrate to which the die is mounted, the pads being connected through the substrate by conductive vias or the like. Examples of stacked chip arrangements and interconnect structures are provided in U.S. Patent App. Pub. No. 2010/0232129, the disclosure of which is incorporated by reference herein.

However, some stacked arrangements where the surfaces of dies or devices are in intimate contact or proximity to each other are sensitive to the presence of particles or contamination (e.g., greater than 0.5 nm) on one or both surfaces of the stacked dies. For instance, particles remaining from processing steps can result in poorly bonded regions between the stacked dies. Temporary bonding of dies and substrates, for processing or handling, can be particularly problematic, since removal of temporary carriers and substrates can leave behind bonding layer residue.

Residue from temporary bond layers, which can be comprised of high temperature polymers, can be discontinuous with varying thicknesses on the substrate surface (e.g., thickness may range from 50 nm to 30 um). Plasma ashing can be used to remove thin residue, but even long oxygen plasma ashing steps (e.g., over 40 minutes) may not remove the thickest residues, and in many instances, may oxidize the conductive interconnect layer, for example, a copper interconnect layer. In such cases, a high temperature (e.g., over 50° C.) wet process is sometimes used to remove thick residue; however, the process may not be compatible with other die layers or materials. For instance, the high temperature wet process can degrade the smoothness of the polished metal layers, reducing device yield.

BRIEF DESCRIPTION OF THE DRAWINGS

The detailed description is set forth with reference to the accompanying figures. In the figures, the left-most digit(s) of a reference number identifies the figure in which the reference number first appears. The use of the same reference numbers in different figures indicates similar or identical items.

For this discussion, the devices and systems illustrated in the figures are shown as having a multiplicity of components. Various implementations of devices and/or systems, as described herein, may include fewer components and remain within the scope of the disclosure. Alternately, other implementations of devices and/or systems may include additional components, or various combinations of the described components, and remain within the scope of the disclosure.

SUMMARY

Representative implementations provide techniques for processing integrated circuit (IC) dies and related devices, in preparation for stacking and bonding the devices. Processed devices can be left with surface residue, negatively affecting bonding. The disclosed techniques improve residue removal from the device surfaces while protecting the underlying layers. One or more sacrificial layers may be applied to a surface of the device during processing to protect the underlying layers. Processing residue attached to the sacrificial layer(s) instead of the device can be removed with the sacrificial layer(s).

In various implementations, example processes include wet etching the surface of the device to remove the sacrificial layers and residue. In some embodiments, one or more of multiple sacrificial layers are removed at different processing stages to protect underlying layers during the processing stages. In some examples, a selective etchant (a wet etchant) may be used to remove one or more sacrificial layers and residue without damaging the surface of the device or damaging metallic interconnect structures on the surface of the device.

Various implementations and arrangements are discussed with reference to electrical and electronics components and varied carriers. While specific components (i.e., wafers, integrated circuit (IC) chip dies, etc.) are mentioned, this is not intended to be limiting, and is for ease of discussion and illustrative convenience. The techniques and devices discussed with reference to a wafer, die, or the like, are applicable to any type or number of electrical components, circuits (e.g., integrated circuits (IC), mixed circuits, ASICS, memory devices, processors, etc.), groups of components, packaged components, structures (e.g., wafers, panels, boards, PCBs, etc.), and the like, that may be coupled to interface with each other, with external circuits, systems, carriers, and the like. Each of these different components, circuits, groups, packages, structures, and the like, can be generically referred to as a "microelectronic element." For simplicity, such components will also be referred to herein as a "die" or a "substrate."

The disclosed processes are illustrated using graphical flow diagrams. The order in which the disclosed processes are described is not intended to be construed as a limitation, and any number of the described process blocks can be combined in any order to implement the processes, or alternate processes. Additionally, individual blocks may be deleted from the processes without departing from the spirit and scope of the subject matter described herein. Furthermore, the disclosed processes can be implemented in any suitable manufacturing or processing apparatus or system, along with any hardware, software, firmware, or a combination thereof, without departing from the scope of the subject matter described herein.

Implementations are explained in more detail below using a plurality of examples. Although various implementations and examples are discussed here and below, further implementations and examples may be possible by combining the features and elements of individual implementations and examples.

DETAILED DESCRIPTION

Overview

Various embodiments of techniques for processing integrated circuit (IC) dies and related devices, in preparation for stacking and bonding the devices, are disclosed. Devices undergoing processing can be left with surface residue from the process steps, negatively affecting bonding. The disclosed techniques improve residue removal from the device surfaces while protecting the underlying layers.

In various embodiments, using the techniques disclosed can simplify the stacking process for minimal tolerance stacking and bonding techniques, reduce die fabricating and processing costs and improve profit margins, reduce defects in temporary bonding operations, allow for higher stacked device yield, eliminate key process defects, and can reduce handling of dies to minimize particle generation. Dies to be stacked and bonded using surface to surface direct bonding techniques without adhesive, such as "ZIBOND®," and/or hybrid bonding, such as "Direct Bond Interconnect (DBI®)" both available from Ziptronix, Inc., a Xperi Technologies company (see for example, U.S. Pat. Nos. 6,864,585 and 7,485,968, which are incorporated herein in their entirety), which can be susceptible to particles and contaminants due to the need for an extremely flat interface, can particularly benefit. The removal of particles between opposing insulator, semiconductor, and/or conductor layers improves the flatness of the surfaces and, accordingly, the ability of the two surfaces to bond.

Figure 1:
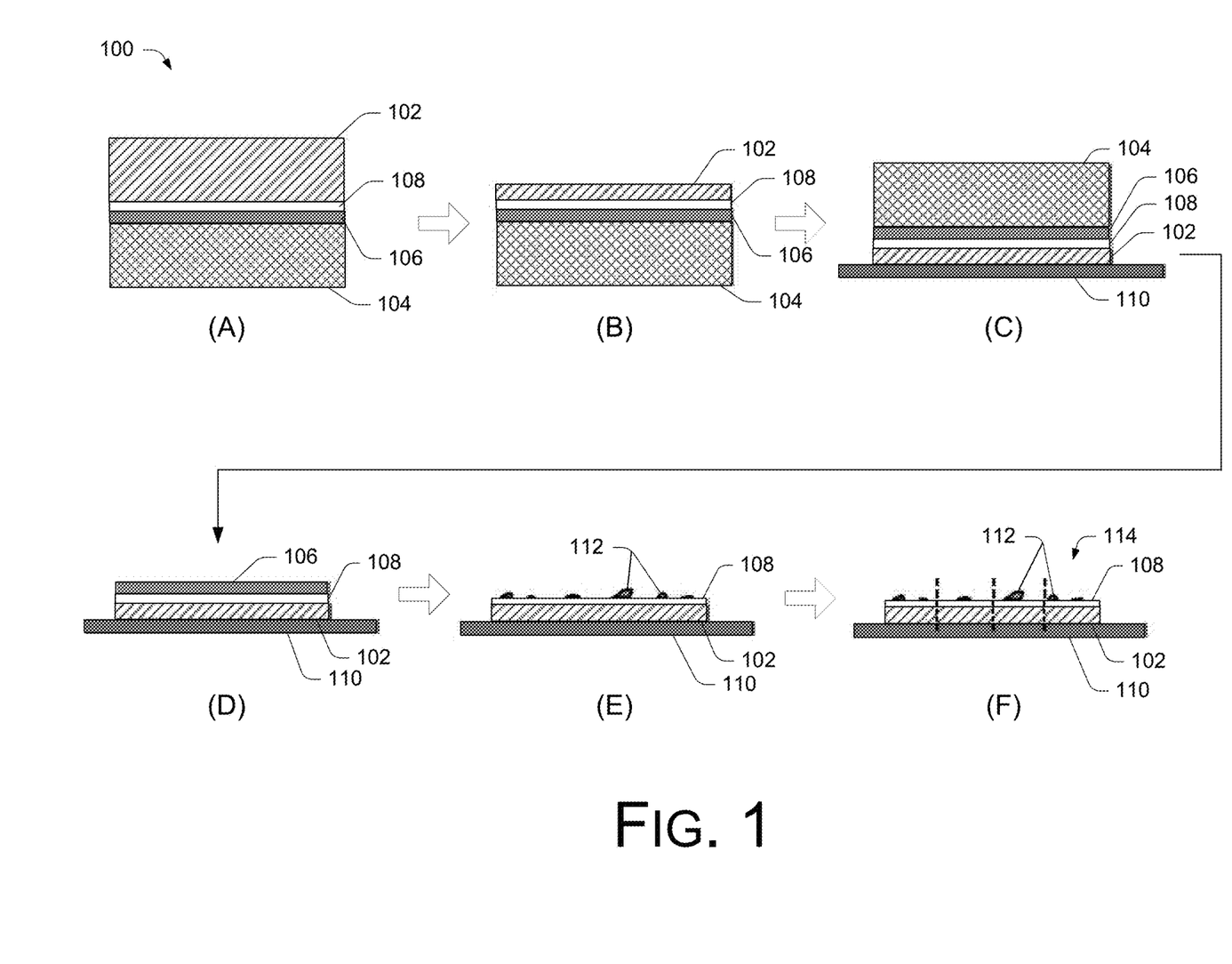
FIG. 1 is a schematically illustrated flow diagram illustrating an example die processing sequence.

For example, a graphically illustrated flow diagram is shown at FIG. 1, illustrating an example die processing sequence 100. At block (A) the process begins with preparing a substrate assembly by bonding a substrate handle 104 to a substrate 102 including one or more devices (devices not shown) using a temporary bonding layer 106. Wiring layers 108 of the substrate 102 are comprised of a metal (such as copper, etc.), and are contacted by the bonding layer 106. In various examples, the bonding layer 106 is comprised of a high temperature polymer, an epoxy, polyimide, an acrylic, or the like, to ensure the handle 104 remains bonded to the device 102 during processing.

At block (B), a portion of the back side of the substrate 102 is removed to the desired dimensions, using one or more techniques (e.g., grinding, chemical mechanical polishing/planarizing (CMP), reactive-ion etching (RIE), etc.). The backside of the thinned substrate 102 may be processed further, for example, to form an interconnect routing layer, a passive component layer, or other structures or features of interest. At block (C), the substrate 102 with one or more devices is attached to a dicing sheet 110 for singulation. The handle substrate 104 is now on the "topside," in preparation for its removal.

At block (D), the handle 104 may be removed, by grinding, etching, polishing, sliding off, or by optical degrading of the temporary bonding adhesive layer 106, etc.). At block (E), the temporary bond layer 106 is removed. As shown at block (E), the removal process typically leaves some residue 112 behind. The residue 112 can have varying thicknesses (e.g., thickness may range from 5 nm to 30 um, or even higher). Plasma ashing can be used to remove thin residue 112, but even long oxygen plasma ashing steps (e.g., over 40 minutes) may not remove the thickest residues 112, and in many instances, may oxidize the wiring layer 108, for example, a copper interconnect layer 108. Longer ashing times also may roughen the surface of the exposed wiring layer 108, which can reduce the yield of the bonded devices. In some cases, a high temperature (e.g., over 50° C.) wet etch process is used to remove thick residue 112; however, the process may not be compatible with other die layers or materials. For instance, the high temperature wet process can dissolve portions of the surface the conductive metals of the wiring layer(s) 108, thus degrading the metal wiring layer(s) 108, removing more metal than is desirable and leaving a rough surface topography. In some low-tolerance bonding methods, such as "ZIBOND®" and "Direct Bond Interconnect (DBI®)", it is desirable for the metal topography (e.g., of the wiring layer(s) 108) to have less than 10 nm variance for successful bonds.

At block (F), the substrate 102 is singulated into dies 114. As shown, the residue 112 may remain on the dies 114, potentially resulting in poor bonding, and reduced product yield.

Example Implementations

In various implementations, one or more protective layers can be applied to sensitive device layers prior to bonding carriers or handle substrates to the sensitive layers. Removal of the protective (sacrificial) layer(s) also removes any residue left when removing the bonding layer. In various embodiments, the protective layer may be removed using a room-temperature or near room-temperature process that does not damage the underlying sensitive insulating and conductive layers.

Figure 2:
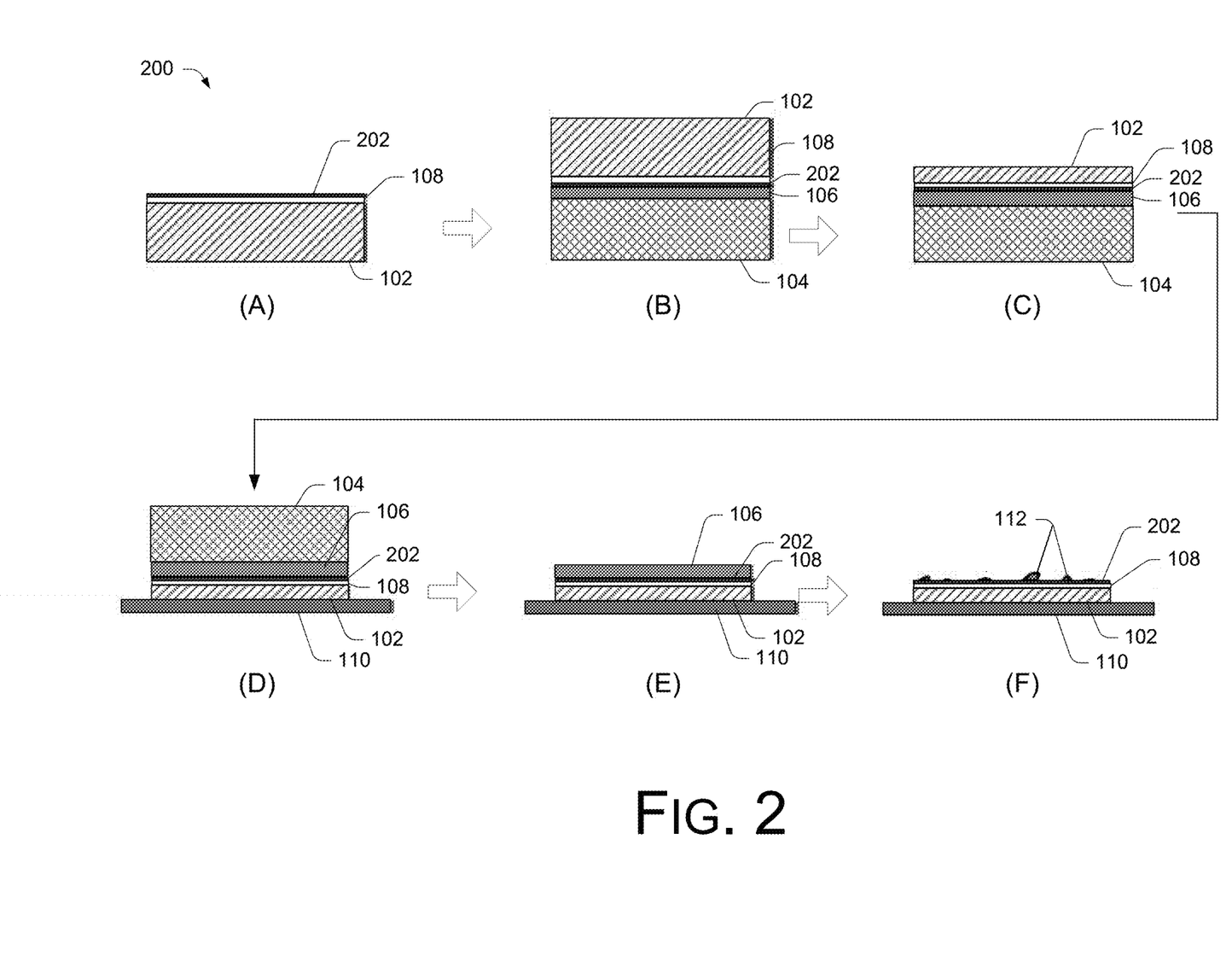
FIGS. 2 and 3 show a schematically illustrated flow diagram illustrating an example die processing sequence, according to a first embodiment.
Figure 3:
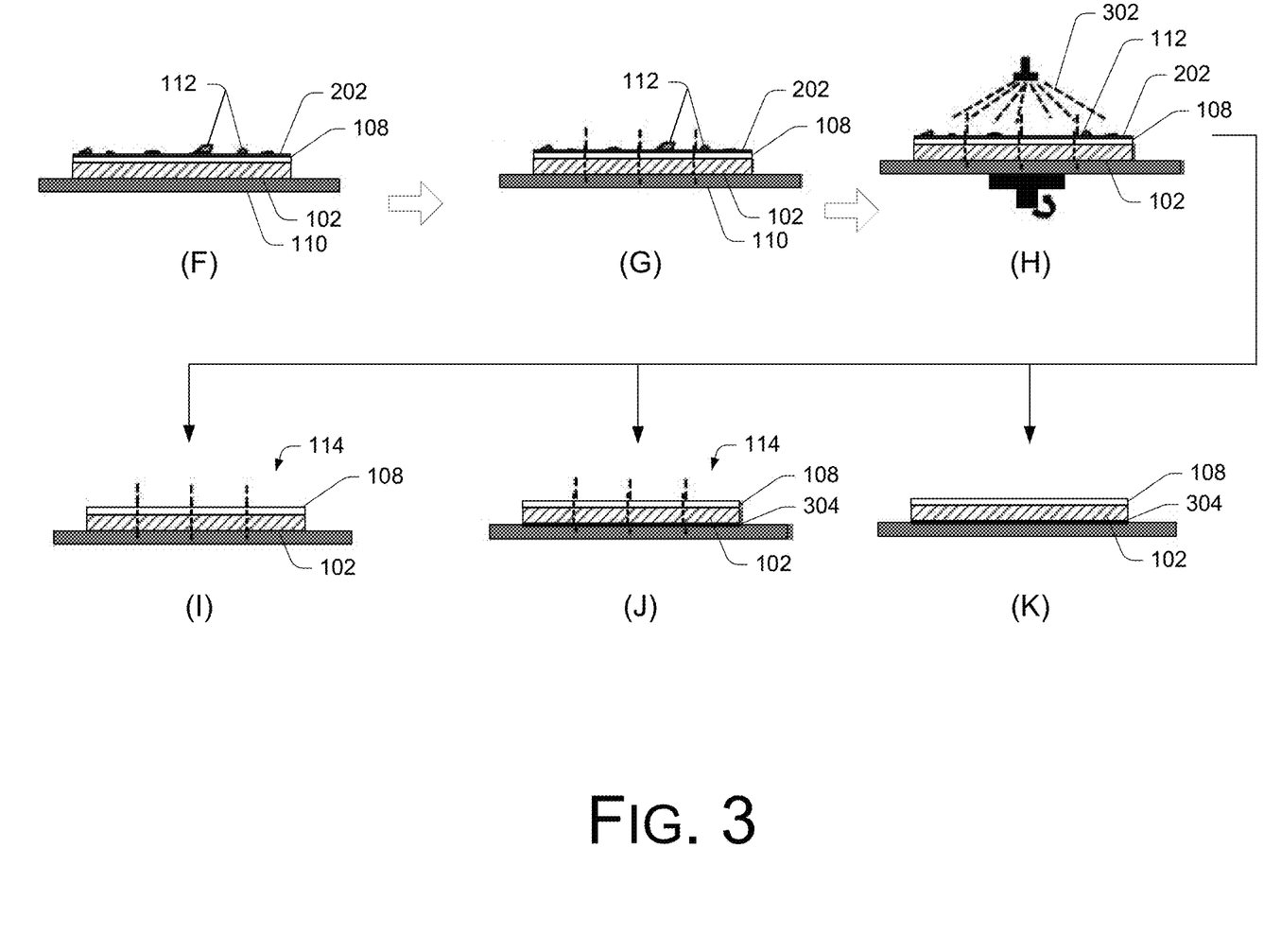

For example, FIGS. 2 and 3 show a graphically illustrated flow diagram illustrating an example die processing sequence 200, according to a first embodiment. As shown in FIG. 2 at block (A), prior to applying the temporary adhesive 106 and handle substrate 104, a thin inorganic protective layer 202 is formed (spun on, for example) over the wiring layer 108 of the substrate 102. In various embodiments, the protective layer 202 may comprise one or more of SiO2 (silicon dioxide), B—SiO2 (i.e. boron doped silicon dioxide), P—SiO2 (i.e. phosphorus doped silicon dioxide), or the like. In other embodiments, the protective layer 202 may comprise a non-stoichiometric dielectric material (non-device quality dielectric material) coated by a lower temperature plasma enhanced chemical vapor deposition (PECVD), an atomic layer deposition (ALD), a plasma enhanced atomic layer deposition (PEALD), or like methods. The protective layer 202 may be less than 50 nm thick in some embodiments (thicker or thinner in other embodiments). As part of the process, depending on the nature of the coating process, the protective layer 202 may be cured at a temperature less than 100° C. in inert gas or vacuum for approximately 30 minutes. In various other implementations, the curing temperature and time and ambient environment may vary. In some cases, the protective layer 202 may be subsequently treated with plasma radiation prior to adding the adhesive layer 106.

At block (B) the substrate 102 including one or more devices (devices not shown) is bonded to a handle substrate 104 using a temporary adhesive 106, as described above. In the example process 200, the bond layer 106 contacts the protective (sacrificial) layer 202 instead of contacting the metal wiring layer 108. In this way, the sensitive metallic wiring layer 108 is protected from the adhesive 106 and its residue 112. At block (C), the substrate 102 is reduced as desired for the intended application and processed further as needed. At block (D), the reduced substrate 102 is attached to a dicing sheet 110, with the handle 104 topside.

At block (E), the handle 104 is removed, and at block (F), the temporary bond layer 106 is removed, leaving residue 112 behind. In this example process 200, the residue 112 is left on the protective layer 202 rather than the metal wiring layer 108. In some other embodiments, the undesirable residue 112 may be residue from the dicing sheet or grinding sheet adhesive. Regardless of the source of the undesirable residue 112, the devices utilizing the substrate 102 are formed in such a sequence that the undesirable residue 112 is in contact with the protective sacrificial layer 202.

Referring to FIG. 3, the process 200 is continued. Block (F) is illustrated again in FIG. 3 for continuity and ease of discussion. As an optional process step, at block (F) the residue 112 may be exposed to oxygen plasma, for less than 10 minutes for example, to remove the thinner residue 112. In an embodiment, the plasma exposure can also increase the hydrophilicity and weaken the bonds in the coated inorganic protective layer 202, and make the protective layer 202 and the residue 112 easier to clean off the substrate 102. At block (G), the substrate 102 is singulated into dies 114. As shown at block (G), residue 112 may remain (or further accumulate) on the dies 114, on the protective layer 202, after singulation.

At block (H), a wet dilute etchant 302 (e.g., buffered oxide etchant (BHF), hydrofluoric acid (HF), glycated dilute BFH or HF, or the like), for instance, with fluoride ions concentration less than 2% and preferably less than 0.2%, is sprayed onto the dies 114 to break up and remove the inorganic protective layer 202. In some embodiments, it is preferable that the etchant 302 includes a complexing agent to suppress the etching of the metal in the wiring layer 108 beneath the protective layer 202. The complexing agent may comprise, for example where the conductive metal is copper, a complexing agent with a triazole moiety, or the like. The wet etchant 302 may be applied by spin process (as illustrated), another batch process, or the like, for a preselected duration of time, as desired. The complexing agent may be removed in a subsequent cleaning operation with a suitable solvent, for example, a solvent containing an alcohol.

At block (I), the singulated dies 114 are shown free from residue 112. The removal of the protective layer 202 also removes the residue 112 from the surface of the dies 114, without degrading the wiring layer 108 of the dies 114. In an embodiment, as shown at blocks (J) and (K), one or more additional inorganic (or organic, in alternative embodiments) protective layers 304 are shown as having been previously added to the second (opposite) surface of the substrate 102. For instance, in various implementations, the additional protective layer(s) 304 can be optionally added to the second surface of the substrate 102 to protect the substrate 102 during various processes. The protective layer(s) 304 may be added prior to locating the substrate 102 onto the dicing sheet, for instance (see block (D)). In such an embodiment, the protective layer(s) 304 may protect the second surface of the substrate 102 from residue or adhesive associated with the dicing sheet, or may facilitate cleaning such residue from the second surface of the substrate 102. At block (J) the substrate 102 is shown singulated into dies 114 and at block (K) the substrate 102 is shown intact.

Figure 4:
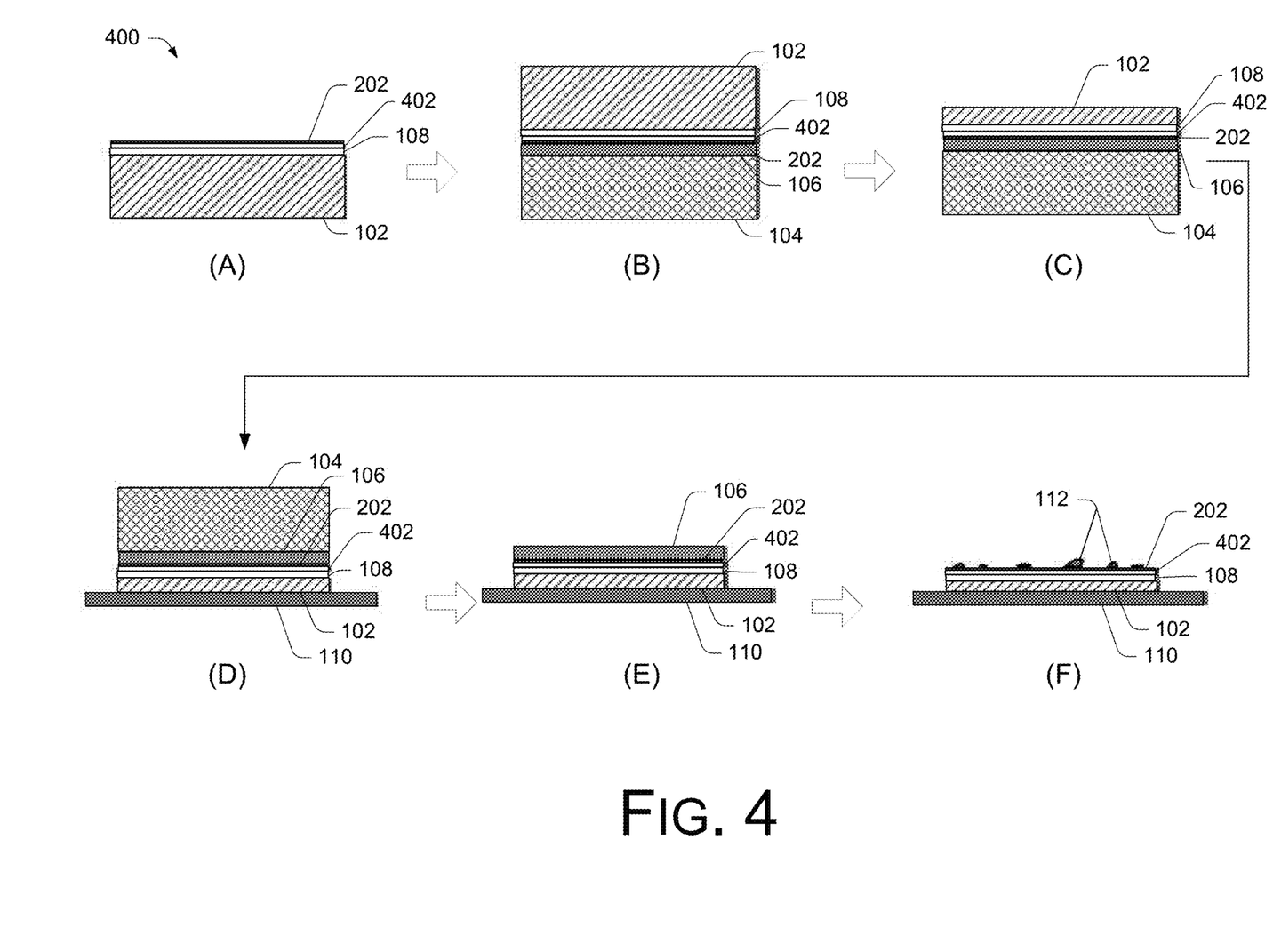
FIGS. 4 and 5 show a schematically illustrated flow diagram illustrating an example die processing sequence, according to a second embodiment.
Figure 5:
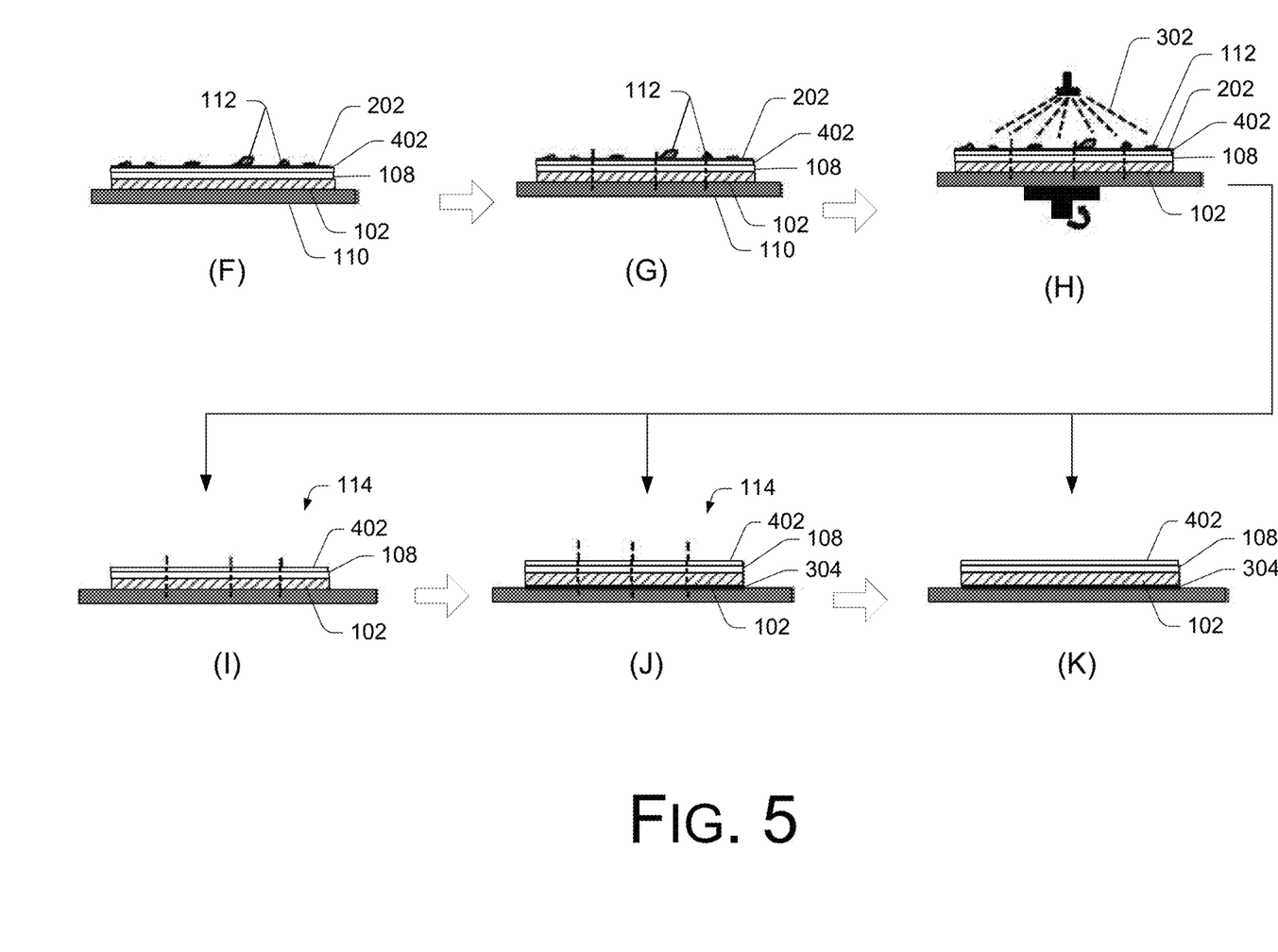

Another example die processing sequence 400 is shown at FIGS. 4 and 5, according to various embodiments. In the embodiments, two or more protective layers 202 and 402 are applied to the metal wiring layer 108 prior to the adhesive 106. In an embodiment, the wiring layer 108 is protected with an organic protective layer 402 (such as an organic resist, or the like), and the organic protective layer 402 is protected by the inorganic protective (sacrificial) layer 202, as discussed above, prior to bonding the handle substrate 104 to the substrate 102. In the embodiments, the use of additional protective layers (such as the protective layer 402) allows underlying layers (such as the wiring layer 108) to be protected while exposed layers are processed. For instance, the additional organic protective layer 402 allows the protective layer 202 to be removed using chemicals and/or techniques that may be harmful (e.g., corrosive, roughening, depletive) to the wiring layer 108.

Referring to FIG. 4, at block (A), the substrate 102 including one or more devices (devices not shown) is initially coated with a thin (spun on, for example) organic protective layer 402 over the wiring layer 108, followed by the thinner inorganic protective layer 202 (e.g., SiO2, B—SiO2, P—SiO2, and the like), as described above.

At block (B) the substrate 102 is bonded to a handle substrate 104 using a temporary bond 106, as described above. Also in this example, the bond layer 106 contacts the protective (sacrificial) layer 202 instead of contacting the metal wiring layer 108 or the organic layer 402. At block (C), the substrate 102 is reduced as desired, and at block (D), the reduced substrate 102 is attached to a dicing sheet 110, with the handle 104 topside.

At block (E), the handle 104 is removed, and at block (F), the temporary bond layer 106 is removed, generally leaving residue 112 behind. Also in this example, the residue 112 is left on the protective layer 202 rather than the metal wiring layer 108 or the organic layer 402.

Referring to FIG. 5, the process 400 is continued. Block (F) is reproduced at FIG. 5 for continuity and ease of discussion. Optionally, at block (F) the residue 112 may be exposed to oxygen plasma, for less than 10 minutes for example, to remove the thinner residue 112 layer and also to increase the hydrophilicity and weaken the bonds in the coated inorganic protective layer 202. This can make the protective layer 202 and the residue 112 easier to clean off the substrate 102. At block (G), the substrate 102 is optionally singulated into dies 114. As shown, the residue 112 may remain on the dies 114, on the protective layer 202. At block (H), a wet dilute etchant 302 (e.g., buffered oxide etchant (BHF), hydrofluoric acid (HF), or the like), is sprayed onto the dies 114 to break up and remove the inorganic protective layer 202. The wet etchant 302 may be applied by spin process, or the like, for a preselected duration of time as desired. The protective organic layer 402 remains on the dies 114.

At block (I), the singulated dies 114 are shown substantially free from residue 112. The removal of the protective layer 202 also removes the residue 112 from the surface of the dies 114, without degrading the wiring layer 108, at least in part due to the protective organic layer 402 over the wiring layer 108. In an embodiment, as shown at blocks (J) and (K), one or more additional inorganic or organic protective layer 304 are shown as having been previously added to the second (opposite) surface of the substrate 102. For instance, in various implementations, the additional protective layer(s) 304 can be optionally added to the second surface of the substrate 102 to protect the substrate 102 during various processes. The protective layer(s) 304 may be added prior to locating the substrate 102 onto the dicing sheet, for instance (see block (D)). In such an embodiment, the protective layer(s) 304 may protect the second surface of the substrate 102 from residue or adhesive associated with the dicing sheet, or may facilitate cleaning such residue from the second surface of the substrate 102. At block (J) the substrate 102 is shown singulated into dies 114 and at block (K) the substrate 102 is shown intact.

In one embodiment, after the removal of the temporary bonding layer 106 as depicted in FIG. 1 at block (E), FIG. 3 at block (F) and FIG. 5 at block (F) for example, the undesirable residue 112 may be removed by removing the layer 202 prior to the singulation step. In other words, the substrate 102 may be singulated with or without the protective layer 202. For example, the substrate 102 may be coated with a protective layer (such as the layer 202, for example) before the singulation step to prevent dicing debris from mechanical dicing (e.g., sawing) from adhering to the wiring layer 108 during singulation, and to allow the dicing debris to be removed along with the protective layer 202.

In various embodiments, other protective layer combinations (and any number of protective layers) may be used to protect underlying layers from the effects of process steps. Each protective layer may be chemically engineered to be selectively removed, while a layer below the protective layer being removed protects underlying layers, such as the wiring layer 108, for instance. An organic layer may be hydrophobic or hydrophilic to act as an affinity for a solvent used. For example, a two-layer combination may include two photoresist layers, one hydrophobic layer and one inorganic layer, or the like. A combination of three or more protective layers may also be used in a similar way, as each layer acts to protect a lower layer from negative effects of processing. In general, ensuring that the wiring layer 108 is not degraded by metal removal or roughing of the topography is the goal of the one or more protective layers. In various embodiments, after the wet cleaning steps, the processed substrates or dies may be further processed prior to bonding to another clean dielectric surface.

CONCLUSION

Although the implementations of the disclosure have been described in language specific to structural features and/or methodological acts, it is to be understood that the implementations are not necessarily limited to the specific features or acts described. Rather, the specific features and acts are disclosed as representative forms of implementing example devices and techniques.

Each claim of this document constitutes a separate embodiment, and embodiments that combine different claims and/or different embodiments are within the scope of the disclosure and will be apparent to those of ordinary skill in the art upon reviewing this disclosure.

What is claimed is:

1. A method of forming a microelectronic assembly, comprising:
   providing a substrate having an exposed conductive wiring layer level with or below a bonding surface of the substrate;
   coating the conductive wiring layer with one or more protective sacrificial layers;
   bonding a handle substrate to the one or more protective sacrificial layers using a temporary bonding layer;
   processing the substrate while the handle substrate is bonded to the substrate;
   removing the handle substrate;
   removing the temporary bonding layer;
   exposing the substrate, the one or more protective sacrificial layers, and a residue of the temporary bonding layer to a wet etchant for a preselected duration of time, the wet etchant decomposing at least one protective sacrificial layer, wherein the wet etchant comprises a complexing agent adapted to suppress dissolution of the conductive wiring layer; and washing said at least one protective sacrificial layer and the residue of the processing from the conductive wiring layer.

2. The method of claim 1, further comprising exposing the substrate, the one or more protective sacrificial layers, and the residue to an oxygen plasma radiation for a preselected duration to modify the moisture absorption characteristics of the one or more protective sacrificial layers, prior to exposing the substrate, the one or more protective sacrificial layers, and the residue to the wet etchant.

3. The method of claim 1, further comprising coating a surface of the substrate opposite the conductive wiring layer with an organic or inorganic protective layer.

4. The method of claim 1, wherein the processing includes removing a portion of the substrate from a surface of the substrate opposite the conductive wiring layer while the handle substrate is bonded to the substrate.

5. The method of claim 1, wherein one or more of the protective sacrificial layers comprises an inorganic silicon dioxide (SiO2), boron doped silicon dioxide (B—SiO2), or phosphorus doped silicon dioxide (P—SiO2) material.

6. The method of claim 1, wherein the one or more protective sacrificial layers comprises an organic protective layer over the conductive wiring layer and an inorganic protective layer over the organic protective layer, the organic protective layer adapted to protect the conductive wiring layer from degradation due to removal of the inorganic protective layer and the residue.

7. The method of claim 1, wherein the wet etchant comprises a buffered oxide etchant (BHF) or hydrofluoric acid (HF).

8. The method of claim 1, wherein the one or more of the protective sacrificial layers is applied using spin coating, plasma physical vapor deposition (PVD), or using an electrophoretic process.

9. The method of claim 1, wherein the substrate is singulated before removal of the sacrificial protective layer.

10. The method of claim 1, wherein the substrate is singulated after removal of the sacrificial protective layer.

11. The method of claim 1, wherein the conductive wiring layer is not degraded, roughened, or corroded by exposure to the wet etchant.

12. A method of forming a microelectronic assembly, comprising:
    providing a substrate having an exposed wiring layer level with or below a bonding surface of the substrate;
    coating the wiring layer with one or more protective sacrificial layers;
    processing the substrate;
    exposing the substrate, the one or more protective sacrificial layers, and a residue of the processing to a wet etchant for a preselected duration of time, the wet etchant decomposing at least one protective sacrificial layer;
    washing said at least one protective sacrificial layer and the residue of the processing from the wiring layer, wherein the wet etchant comprises a complexing agent adapted to suppress dissolution of the conductive wiring layer; and
    stacking the substrate on another substrate through a direct bonding of the wiring layer of the substrate and a surface of the other substrate.

13. The method of claim 12, wherein processing the substrate further comprises:
    bonding a temporary substrate to the one or more protective sacrificial layers using a temporary bonding layer;
    processing the substrate while the temporary substrate is bonded to the one or more protective sacrificial layers; and
    removing the temporary substrate and the temporary bonding layer.

14. The method of claim 12, further comprising removing a residue of the processing by removing the one or more protective sacrificial layers.

15. The method of claim 12, further comprising removing a residue of the processing without degrading, roughening, or corroding the wiring layer with the wet etchant.

16. The method of claim 12, further comprising removing a residue of the processing without exposing the wiring layer to the wet etchant.

17. The method of claim 12, further comprising singulating the substrate prior to removing one or more of the protective sacrificial layers.

18. A method of forming a microelectronic assembly, comprising:
    providing a substrate having an exposed conductive wiring layer level with or below a bonding surface of the substrate;
    coating the conductive wiring layer with one or more protective sacrificial layers;
    bonding a handle substrate to the one or more protective sacrificial layers using a temporary bonding layer;
    processing the substrate while the handle substrate is bonded to the substrate;
    removing the handle substrate;
    removing the temporary bonding layer;
    exposing the substrate, the one or more protective sacrificial layers, and a residue of the temporary bonding layer to an oxygen plasma radiation for a preselected duration to modify the moisture absorption characteristics of at least one of the one or more protective sacrificial layers;
    exposing the substrate, the one or more protective sacrificial layers, and the residue of the temporary bonding layer to a wet etchant for a preselected duration of time, the wet etchant decomposing at least one protective sacrificial layer, wherein the one or more protective sacrificial layers comprises an organic protective layer over the conductive wiring layer and an inorganic protective layer over the organic protective layer, the organic protective layer adapted to protect the conductive wiring layer from degradation due to removal of the inorganic protective layer and the residue; and
    washing said at least one protective sacrificial layer and the residue of the temporary bonding layer from the conductive wiring layer.

19. The method of claim 18, further comprising selectively removing the protective sacrificial layer while protecting an underlying layer below.

20. A method of forming a microelectronic assembly, comprising:
    providing a substrate having an exposed conductive wiring layer level with or below a bonding surface of the substrate;
    coating the conductive wiring layer with one or more protective sacrificial layers;
    processing the substrate;
    exposing the substrate, the one or more protective sacrificial layers, and a residue of the processing to a wet etchant for a preselected duration of time, the wet etchant decomposing at least one protective sacrificial layer, wherein the wet etchant comprises a complexing agent adapted to suppress dissolution of the conductive wiring layer.

21. A method of forming a microelectronic assembly, comprising:
   providing a substrate having an exposed conductive wiring layer level with or below a bonding surface of the substrate;
   coating the conductive wiring layer with an organic sacrificial protective layer over the conductive wiring layer and an inorganic sacrificial protective layer over the organic sacrificial protective layer, the organic sacrificial protective layer adapted to protect the conductive wiring layer from degradation due to removal of the inorganic sacrificial protective layer;
   processing the substrate;
   exposing the substrate, the inorganic sacrificial protective layer, and a residue of the processing to a wet etchant for a preselected duration of time, the wet etchant decomposing at least the inorganic sacrificial protective layer without degrading, roughening, or corroding the conductive wiring layer.

\* \* \* \* \*